US012641915B2

(12) United States Patent
S.

(10) Patent No.: US 12,641,915 B2
(45) Date of Patent: May 26, 2026

(54) SEMICONDUCTOR DEVICE HAVING A CAVITY UNDER LENS PORTION

(71) Applicant: COMPOUNDTEK PTE. LTD.,
Singapore (SG)

(72) Inventor: Gunasagar S., Singapore (SG)

(73) Assignee: CompoundTek Pte. Ltd, Singapore
(SG)

( * ) Notice: Subject to any disclaimer, the term of this
patent is extended or adjusted under 35
U.S.C. 154(b) by 471 days.

(21) Appl. No.: 18/022,676

(22) PCT Filed: Aug. 26, 2021

(86) PCT No.: PCT/SG2021/050511
§ 371 (c)(1),
(2) Date: Feb. 22, 2023

(87) PCT Pub. No.: WO2022/050897
PCT Pub. Date: Mar. 10, 2022

(65) Prior Publication Data
US 2023/0253518 A1      Aug. 10, 2023

(30) Foreign Application Priority Data

Aug. 27, 2020    (SG) ............................ 10202008277Y

(51) Int. Cl.
*H10F 77/42*        (2025.01)
*H01S 5/02253*      (2021.01)
(Continued)

(52) U.S. Cl.
CPC ....... *H10F 77/484* (2025.01); *H01S 5/02253*
(2021.01); *H10F 71/00* (2025.01); *H10H
20/855* (2025.01); *H10H 20/0363* (2025.01)

(58) Field of Classification Search
CPC .. H10F 77/484; H10F 39/103; H01S 5/02253;
H10H 20/855
(Continued)

(56) References Cited

U.S. PATENT DOCUMENTS

2005/0087784 A1*    4/2005  Lee ........................ H10F 39/811
257/292
2007/0262366 A1*   11/2007  Baek ..................... H10F 39/024
257/292
(Continued)

FOREIGN PATENT DOCUMENTS

KR        100791011 B1      1/2008
KR        20130013701 A      2/2013

OTHER PUBLICATIONS

International Search Report and Written Opinion dated May 19,
2022 for corresponding International Application No. PCT/SG2021/
050511.

*Primary Examiner* — Ratisha Mehta
(74) *Attorney, Agent, or Firm* — Saul Ewing LLP;
Domingos J. Silva; Sean P. Ritchie

(57) ABSTRACT

The present invention relates in one aspect to a semicon-
ductor device (10), comprising a substrate (11), a photonic
semiconductor layer (12), a first insulator layer (13) above
the photonic semiconductor layer (12), and a lens layer (14)
on top of the first insulator layer (13). A method for
fabricating the semiconductor device is also disclosed. The
method comprises the steps of forming a substrate, forming
a photonic semiconductor layer on the substrate, forming a
first insulator layer above the photonic semiconductor layer,
and forming a lens layer on top of the insulator layer.

13 Claims, 6 Drawing Sheets

(51) Int. Cl.
  *H10F 71/00*   (2025.01)
  *H10H 20/855*  (2025.01)
  *H10H 20/01*   (2025.01)

(58) Field of Classification Search
  USPC ................................................. 257/233, 432
  See application file for complete search history.

(56)       References Cited

U.S. PATENT DOCUMENTS

| | | |
|---|---|---|
| 2012/0200728 A1 | 8/2012 | Kobayashi et al. |
| 2014/0306309 A1 | 10/2014 | Kato et al. |
| 2015/0179692 A1* | 6/2015 | Furuta ................. H10F 39/8057 |
| | | 438/69 |
| 2017/0294474 A1* | 10/2017 | Uchihashi ................. G01J 1/42 |

\* cited by examiner

100

110

Forming a substrate

120

Epitaxially growing a photonic semiconductor layer

130

Forming a first insulator layer above the photonic semiconductor layer

140

Forming a lens layer on top of the first insulator layer

SEMICONDUCTOR DEVICE HAVING A CAVITY UNDER LENS PORTION

CROSS-REFERENCE TO RELATED APPLICATIONS

The present application is a 35 U.S.C. § 371 national phase application of, and claims priority to, International Application No. PCT/SG2021/050511, filed Aug. 26, 2021, which claims priority from Singapore patent application Ser. No. 10202008277Y, filed Aug. 27, 2020, all of which are incorporated herein by reference in their entireties.

FIELD OF THE INVENTION

The disclosures made herein relate generally to the semiconductor devices and more particularly to a semiconductor device such as photodiode, with a suspended lens and a method for fabricating the semiconductor device.

BACKGROUND OF THE INVENTION

Copper interconnect technology is unsuitable for data communication beyond 20 gigabits per second (Gb/s). Unlike the copper interconnect technology, optical signal transmission does not have any Resistive-capacitive (RC)-delay constraints and power dissipation issues and has largely taken over both short and long-haul data transmission. Key components of optical fiber technology are silicon photonics devices e.g. photodiode, light emitting diodes (LED), laser diode and the like, required for optical to electrical signal conversion and vice versa. As such, improving speed and responsivity/emissivity of the photonics devices is crucial for applications like local area networks and chip to chip interconnects. The photodiodes may be of normal incidence (NI) type or edge-coupled (EC) type. Similarly, LEDs may be of surface emitting type or edge emitting type. In NI type photodiodes and surface emitting LEDs, the amount of light incident on the device is dictated by a surface area of the diode.

A method that reduces surface area is therefore advantageous for speed. This can be accomplished by converging/diverging light incident onto/emitted from a smaller diode using a lens. In a typical application of such lenses, a dielectric of higher refractive index is fashioned as a converging lens, and embedded in a film of lower refractive index. In one form of this scheme, these could be silicon nitride (n=2) and silicon dioxide (n=1.45) respectively, materials that are compatible with today's high-volume CMOS fabrication lines. However, integration of such a lens is subject to constraints such as the overall thickness of oxide cladding and refractive indices of commonly used semiconductor films. For a given geometry, a lens of higher refractive index refracts more strongly and is able to focus light onto a smaller diode. The structure of such a focusing lens is shown in FIG. 2. By comparing a typical photodiode working without lens as in FIG. 1 and with lens in FIG. 2, it can be understood that the lens reduces a need for wider photoactive area.

United States Patent Publication No.: US 20060073623 A1 discloses a method for forming a microlens array over a semiconductor substrate. The method employs forming a transparent layer on the substrate and a chemical mechanical polishing (CMP) stop layer on top of the transparent layer. A lens shaping layer is deposited on top of the CMP stop layer and etched to form a concave cavity. Furthermore, the cavity is transferred into the transparent layer through the CMP stop layer by anisotropic etching and lens material is deposited into the cavity to mold the microlens.

U.S. Pat. No. 9,349,765 B2 discloses a suspended lens system for a wafer-level camera, wherein a suspended meniscus lens is bonded to a substrate. The lens system is mounted on an image sensor using a spacer. The suspended meniscus lens is molded in a single molding step and then bonded to the substrate. Since the lens is molded separately and bonded to the substrate, there is high chance of contaminating the lens and also an expensive and complicated alignment system may be needed to accurately align the lens system with respect to the image sensor.

Hence, there is a need for a semiconductor device and a method for fabricating the semiconductor device, wherein the lens can be accurately aligned in a simple manner without contaminating the device. Furthermore, there is need for a lens for the semiconductor device that enables a reduction in size of the photonic semiconductor layer and improves responsivity/emissivity and speed of the device.

SUMMARY OF THE INVENTION

The present invention relates to a semiconductor device, wherein the semiconductor device comprises a substrate, a photonic semiconductor layer, a first insulator layer above the photonic semiconductor layer and a lens layer on top of the first insulator layer. The lens layer includes a lens portion, and the first insulator layer includes a cavity coaxially aligned with the lens portion, wherein perimeter of the cavity is at least equal to perimeter of the lens portion.

In a preferred embodiment, the lens layer includes one or more holes around the lens portion and the first insulator layer includes a cavity beneath the lens portion to suspend the lens portion. A stack of one or more second insulator layers and dielectric layers is formed between the photonic semiconductor layer and the first insulator layer. The second insulator layers and the dielectric layers are alternately arranged upon one another to form the stack.

Furthermore, two or more electrical connectors are provided in the semiconductor device for electrically connecting the photonic semiconductor layer to an external device. The semiconductor device is a photodiode, a light emitting diode (LED), a laser diode or a photovoltaic cell, and the external device is a power source, an electronic component, electronic controller or the like. The lens layer is formed of a dielectric material such as silicon nitride.

In one aspect of the present invention, the photonic semiconductor layer is capable of emitting electromagnetic radiation. In another aspect of the present invention, the photonic semiconductor layer is capable of absorbing electromagnetic radiation.

The suspended lens portion has the maximum thickness greater than maximum thickness of the planer portion. Furthermore, the cavity is formed after the lens layer is deposited on the first insulator layer. Thereby, the present invention allows the lens layer to be formed directly on top of the insulator layer, which turn avoids a need for separately molding the lens and then assembling the same on a semiconductor device is avoided, and therefore any chances of contaminating the semiconductor device during fabrication is eliminated. Furthermore, since the lens layer is formed directly on the device itself, the lens portion can be accurately aligned with the photonic semiconductor layer without using any complicated assembly system.

The present invention also relates to a method for fabricating a semiconductor device. The method comprises the steps of forming a substrate, epitaxially growing a photonic semiconductor layer on the substrate, forming a first insulator layer above the photonic semiconductor layer, forming a lens layer on top of said insulator layer, wherein said lens layer includes a lens portion and a planar portion. The lens layer is formed by etching the first insulator layer to form a pit on a top surface of the insulator layer, depositing a dielectric layer on the top surface of the first insulator layer to form the lens portion in the pit and the planar portion on a remaining portion of the top surface, wherein thickness of the lens portion is greater than thickness of the planer portion. Furthermore, a portion of the insulator layer beneath the lens portion is removed to suspend the lens portion.

BRIEF DESCRIPTION OF THE ACCOMPANYING DRAWINGS

The present invention will be fully understood from the detailed description given herein below and the accompanying drawings which are given by way of illustration only, and thus are not limitative of the present invention, wherein: In the appended drawings.

DETAILED DESCRIPTION OF THE INVENTION

Detailed description of preferred embodiments of the present invention is disclosed herein. It should be understood, however, that the embodiments are merely exemplary of the present invention, which may be embodied in various forms. Therefore, the details disclosed herein are not to be interpreted as limiting, but merely as the basis for the claims and for teaching one skilled in the art of the invention. The numerical data or ranges used in the specification are not to be construed as limiting. The following detailed description of the preferred embodiments will now be described in accordance with the attached drawings, either individually or in combination.

Various terms as used herein are defined below. To the extent a term used in a claim is not defined below, it should be understood with the broadest definition given by persons in the pertinent art to that term as reflected in publications (e.g. dictionaries, article or published patent applications) and issued patents at the time of filing.

Definitions

Suspended lens—A lens for converging or diverging an electromagnetic radiation such as visible light radiation, infrared radiation and ultraviolet radiation, wherein at least 80% of a bottom surface area of the lens is unsupported.

Photonic semiconductor layer—A semiconductor layer capable of converting electrical energy into electromagnetic radiation such as visible light radiation, infrared radiation and ultraviolet radiation, or vice versa.

The present invention relates to a semiconductor device and a method for fabricating the semiconductor device. The device comprises a lens layer including a lens portion and a planar portion, wherein maximum thickness of the lens portion is greater than maximum thickness of the planar portion. Furthermore, a cavity is formed in an insulator layer beneath the lens portion after the lens layer is deposited on the insulator layer to suspend the lens portion. Thereby, the present invention allows the lens layer to be formed directly on a top layer of the device, which turn avoids a need for separately molding a suspended lens and assembling the same on the device, and thus eliminating any chances of contaminating the semiconductor device during fabrication. Furthermore, since the lens layer is formed directly on the device itself, the lens portion can be accurately aligned with a photonic semiconductor layer in the device without using any complicated assembly system. Additionally, the cavity allows the lens portion to be suspended without a need for a supporting means such as legs, thicker than the lens portion, and therefore reducing an overall thickness of the device.

Figure 4:
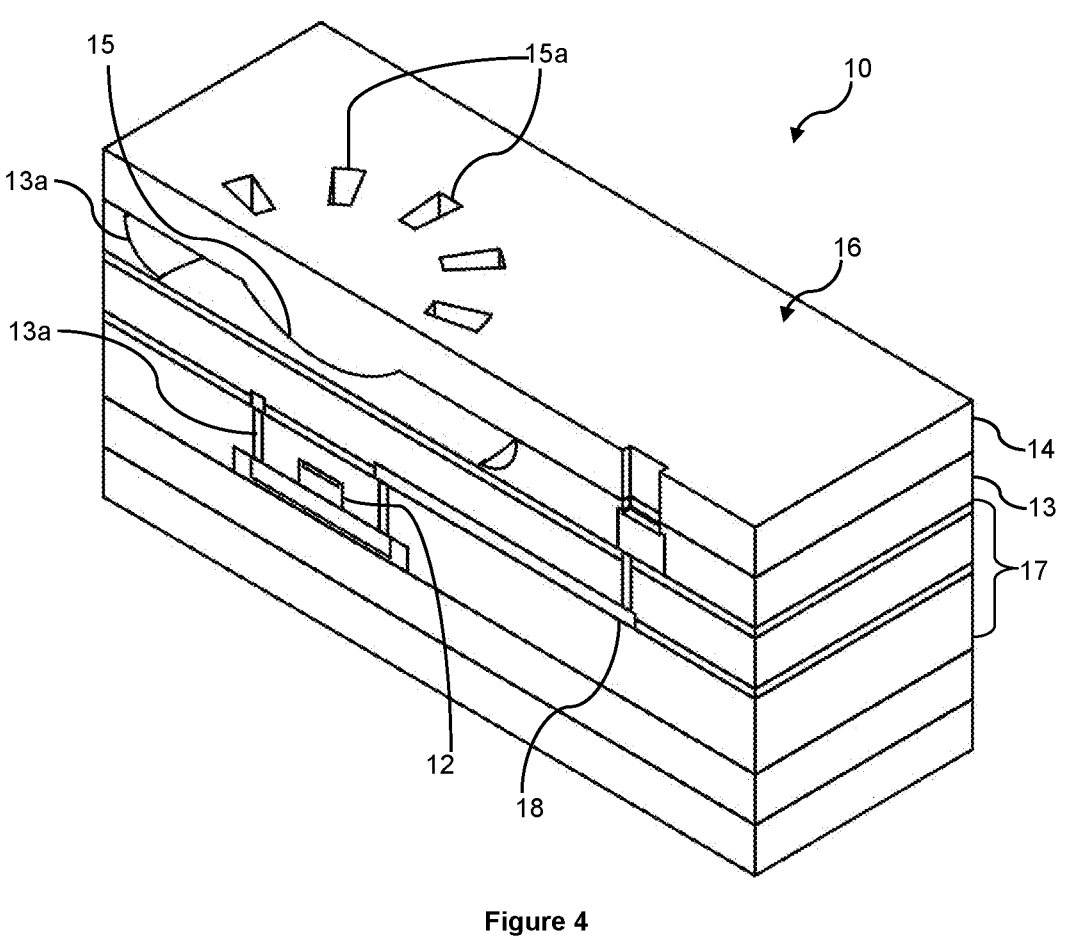
FIG. 4 shows a cut away perspective view of the semiconductor device, in accordance with an exemplary embodiment of the present invention.

Referring to the accompanying drawings, FIG. 4 shows a cut away perspective view of a semiconductor device (10), in accordance with an exemplary embodiment of the present invention. The device (10) comprises substrate (11), a photonic semiconductor layer (12), a first insulator layer (13) and a lens layer (14). In a preferred embodiment, the substrate (11) is a silicon on insulator (SOI) substrate. Alternatively, the substrate (11) can be a silicon substrate, wherein additional layers of semiconductor or insulator material can be formed on the silicon substrate before forming the photonic semiconductor layer (12). The photonic semiconductor layer (12) is formed on top of the substrate (11) and is capable of absorbing or emitting an electromagnetic radiation such as near infrared radiation and visible light radiation.

In a preferred embodiment, the device (10) is a germanium (Ge) photodiode and the photonic semiconductor layer (12) is a Ge layer epitaxially grown on the substrate (11) by a chemical vapor deposition (CVD) process such as ultra-high vacuum CVD (UHVCVD), reduced pressure CVD (RPCVD) and atmospheric-pressure CVD (APCVD). Alternatively, the device (10) can be a light emitting diode (LED), laser diode, photovoltaic cell, sensor and neutron detector, and the photonic semiconductor layer (12) can be a layer of silicon (Si), silicon-germanium (SiGe), silicon carbide (SiC), gallium arsenide (GaAs), aluminum GaAs (AlGaAs), gallium nitride (GaN), aluminum GaN (AlGaN), indium phosphide (InP), indium GaAs phosphide (InGaAsP) or a combination of two or more semiconductors. Similarly, the photonic semiconductor layer (12) can be grown on the substrate (11) by means of a molecular beam epitaxy (MBE) process. Furthermore, the photonic semiconductor layer (12) can also be embedded in a top surface of a silicon substrate by implanting n-type or p-type dopants on the top surface by any conventional means.

The first insulator layer (13) is above the photonic semiconductor layer (12) and the lens layer (14) is on top of the first insulator layer (13). Additionally, a stack (17) of one or more second insulator layers (17a) and dielectric layers (17b) is formed between the photonic semiconductor layer

Figure 5:
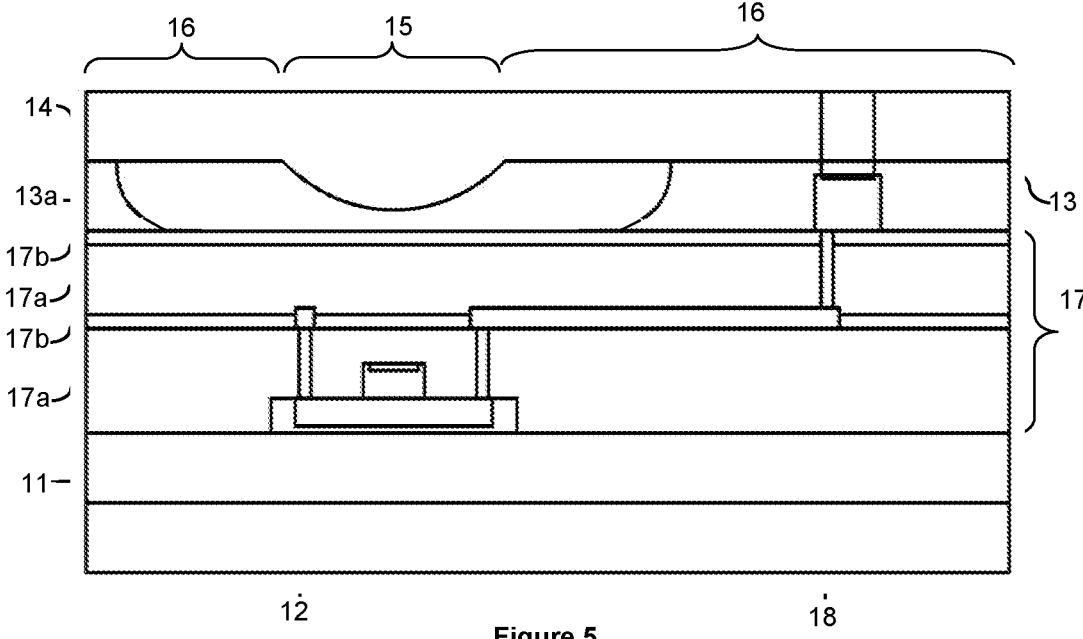
FIG. 5 shows a cut away front view of the semiconductor device, in accordance with an exemplary embodiment of the present invention.

(12) and the first insulator layer (13), as shown in FIG. 5. The second insulator layers (17a) and the dielectric layers (17b) are alternately arranged upon one another to form the stack (17). Preferably, the first and second insulator layers (13, 17a) are formed of silicon dioxide (SiO₂) and the dielectric layers are formed of silicon nitride (SiN). Alternatively, the first and second insulator layers (13, 17a) are formed of any other conventional insulator materials and the dielectric layers are formed of any other conventional dielectric materials. In another embodiment, a single dielectric layer can replace the stack (17) between the photonic semiconductor layer (12) and the first insulator layer (13). Preferably, the lens layer (14) is formed of a complementary metal oxide semiconductor (CMOS) process compliant dielectric material such as SiN. Alternatively, the lens layer (14) can be formed of any other material that allows the electromagnetic radiation to pass through and has a refractive index within a range of 1.46-2.6.

The lens layer (14) includes a lens portion (15) surrounded by a planar portion (16), wherein maximum thickness of the lens portion (15) is greater than maximum thickness of the planar portion (16). Preferably, the maximum thickness of the lens portion (15) is at least 10% thicker than the maximum thickness of the planar portion (16). More preferably, the thickness of the lens portion (15) is configured in such a way that focal length of the lens portion (15) is within a range of 1-12 microns (μm). The lens layer (14) includes one or more holes around the lens portion (15), wherein an isotropic etchant is introduced through the holes to remove a portion of the first insulator layer (13) beneath the lens portion (15) after the lens layer (14) is deposited on the first insulator layer (13).

Upon removing the portion of the first insulator layer (13), a cavity (13a) is formed in the first insulator layer (13) beneath the lens portion (15) to suspend the lens portion (15). The cavity (13a) is coaxially aligned with the lens portion (15) and perimeter of the cavity (13a) is at least equal to perimeter of the lens portion (15).

Figure 8:
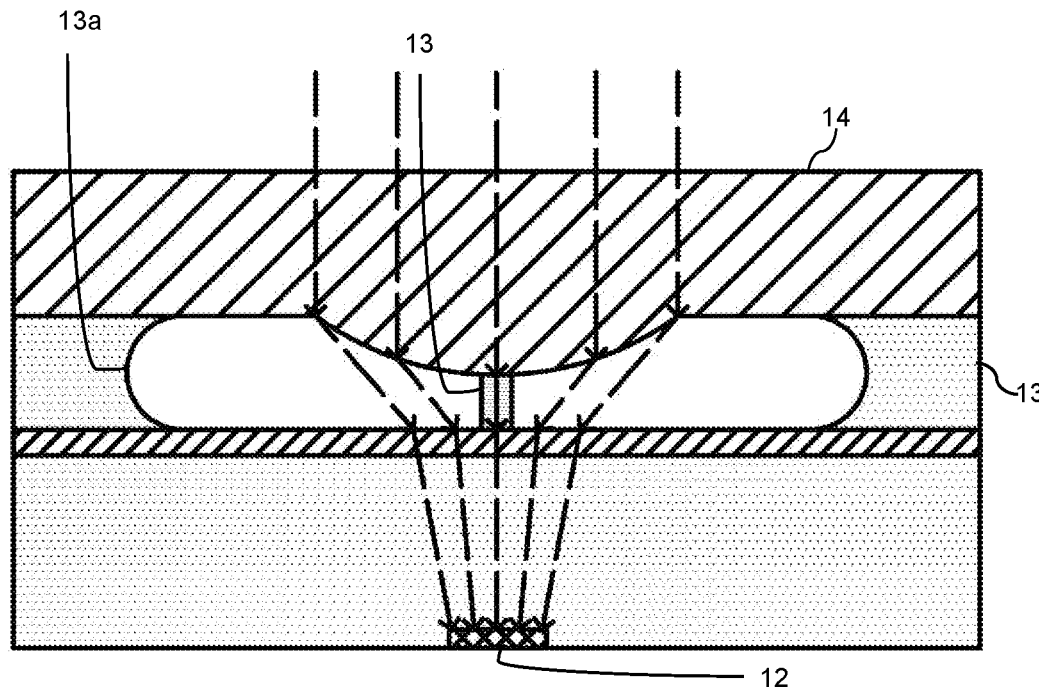
FIG. 8 shows a cross sectional view of the semiconductor device with a first insulator layer supporting 20% of bottom surface the lens portion.

Preferably, at least 80% of a bottom surface area of the lens portion (15) is left unsupported by the first insulator layer (13), as shown in FIG. 8, after the portion of the first insulator layer (13) is removed. Thus, at least 80% of a bottom surface area of the lens portion (15) is exposed to the cavity (13a). More preferably, entire bottom surface of the lens portion (15) is left unsupported by the first insulator layer (13), as shown in FIGS. 4 & 5, after the portion of the first insulator layer (13) is removed The cavity (13) has a flat bottom surface, wherein the flat bottom surface is achieved by controlling a delivery of isotropic etchant into the holes, wherein the cavity (13a) extends between the lens portion (15) and a top surface of the stack (17), as shown in FIGS. 4 & 5. Alternatively, the flat bottom surface can be achieved by etching the first insulator layer (13), wherein a thin portion of the first insulator layer (13) is left below the cavity (13a) without being etched. In a preferred embodiment, a distance between a bottommost portion of the lens portion (15) and the bottom surface of the cavity (13a) is within a range of 0.1-microns (μm)

Figure 7:
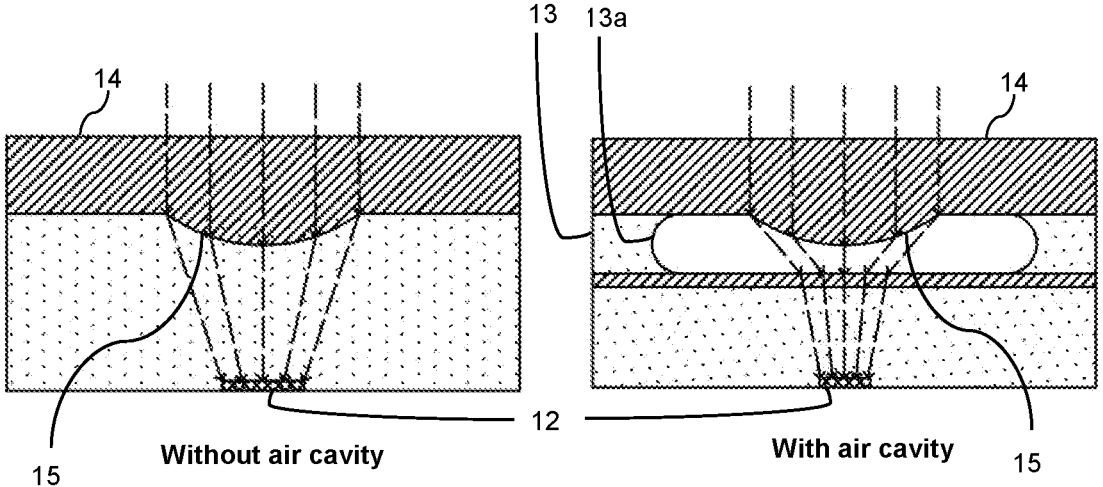
FIG. 7 shows a cross sectional view of course of light rays in the semiconductor device without a cavity below a lens portion and with a cavity below the lens portion.

Due to the cavity (13a) beneath the lens portion (15), convergence angle of a radiation received by the photonic semiconductor layer (12) is narrowed, as shown in FIG. 7, when the present invention is applied for a radiation absorbing application such as photodiode, photovoltaic cell and the like. Similarly, the cavity (13a) beneath the lens portion (15) broadens a divergence angle of a radiation emitted by the photonic semiconductor layer (12), when the present invention is applied for a radiation emitting application such as LED and the like.

In other words, angle of refraction of radiation exiting or entering a bottom surface of the lens portion (15) increases, due to a change in refractive index between air medium in the cavity (13a) and the lens portion (15), and therefore, for a given overall thickness of a die, area of the lens portion (15) can be increased while shortening focal length thereof. Conversely, a focused spot size of the lens portion (15) is reduced without changing a size of the lens portion (15), which in turn enables a reduction in size of the photonic semiconductor layer (12), and thus improving responsivity/emissivity and speed of the photonic semiconductor layer (12).

The suspended lens portion (15) has maximum thickness greater than maximum thickness of the planer portion (16). Furthermore, the cavity (13a) is formed after the lens layer (15) is deposited on the first insulator layer (13) to suspend the lens portion (15a). Thereby, the present invention allows the lens layer (14) to be formed directly on top of the first insulator layer (13), which in turn avoids a need for separately molding a suspended lens and then assembling the same on the device (10), and therefore any chances of contaminating the device (10) during fabrication is eliminated. Furthermore, since the lens layer (14) is formed directly on the device (10) itself, the lens portion (15) can be accurately aligned with the photonic semiconductor layer (12) without using any complicated alignment system. Additionally, the cavity (15a) allows the lens portion (15a) to be suspended without a need for a supporting means such as legs, thicker than the lens portion (15a), and therefore reducing an overall thickness of the device (10).

Additionally, the device (10) comprises two or more electrical connectors for electrically connecting the photonic semiconductor layer (12) to an external device. The external device can be any conventional power source, controlling devices, semiconductor components and the like. The electrical connectors are connected by forming holes through the stack, the first insulator layer (13) and the lens layer (14) and then inserting a conductive material through the holes to make electrical contact with the photonic semiconductor layer (12) and/or the substrate (11). Furthermore, the connectors can include bond pads positioned on top or side surface of the semiconductor device (10).

Figure 6:
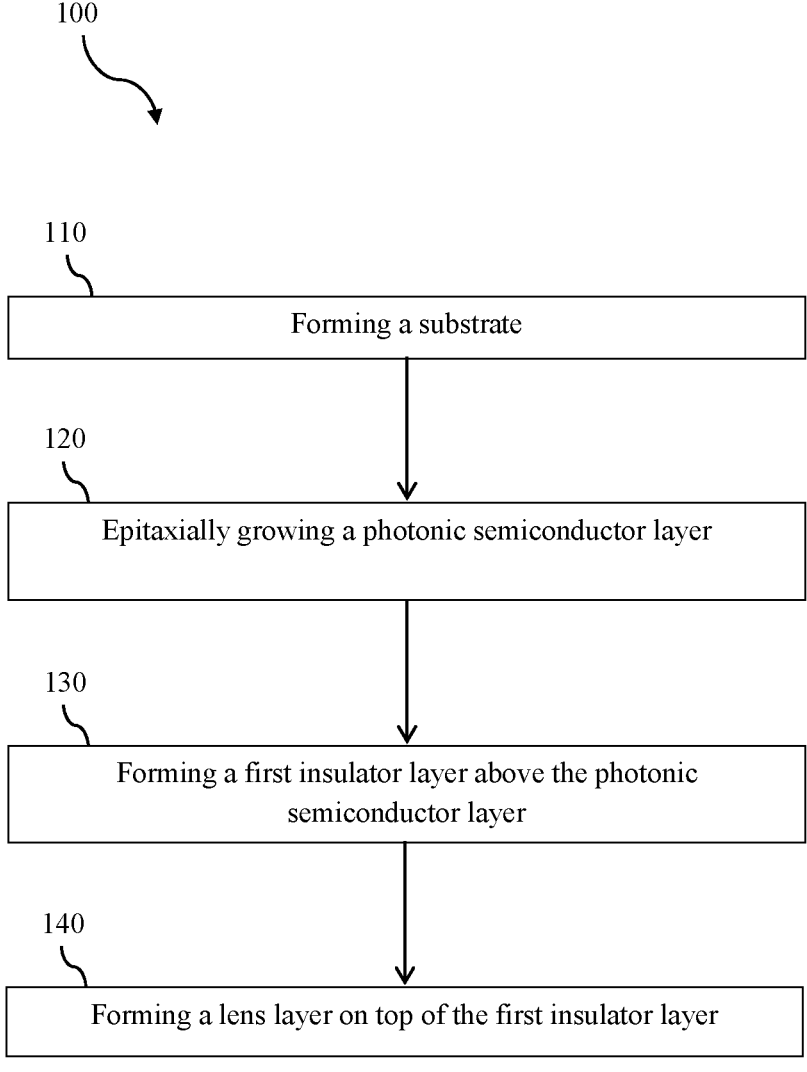
FIG. 6 shows a flow diagram of the method for fabricating the semiconductor device, in accordance with an exemplary embodiment of the present invention.

FIG. 6 shows a flow diagram of a method for fabricating a semiconductor device, in accordance to an exemplary embodiment of the present invention. The method (100) comprises the steps of forming a substrate (110), forming a photonic semiconductor layer (120), forming a first insulator layer above the photonic semiconductor layer (130) and forming a lens layer on top of the insulator layer (140), wherein the lens layer includes one or more lens portions and a planar portion.

The lens layer is formed by etching the insulator layer to form a pit on a top surface of the insulator layer and depositing a dielectric layer on the top surface of the insulator layer to form a lens portion in the pit and a planar portion on a remaining portion of the top surface. Thickness of the lens portion is greater than thickness of the planer portion. In one embodiment, the insulator layer is etched to form multiple pits and one or more dielectric layers are deposited on the top surface to form a lens portion in each pit, wherein each lens portion corresponds to a different photonic semiconductor layer formed on the substrate.

Furthermore, a portion of the insulator layer beneath the lens portion is removed to form a cavity in the insulator layer, wherein a mask layer is deposited on top of the lens layer, one or more holes are formed around the lens portion through a mask layer and the portion of the insulator layer is etched to form the cavity for suspending the lens portion. The cavity is coaxially aligned with the lens portion and perimeter of the cavity is at least equal to perimeter of the lens portion.

Preferably, the portion of the insulator layer is etched by introducing an isotropic etchant through the holes around the lens portion and the mask layer is removed to form the lens layer as a top layer of the semiconductor layer. Optionally, an additionally layer such as an optical filter and a protective layer, can be provided on top of the lens layer. The complete method of fabricating the semiconductor device is explained in the forthcoming paragraphs by referring to the FIGS. 3A-3I.

Figure 1:
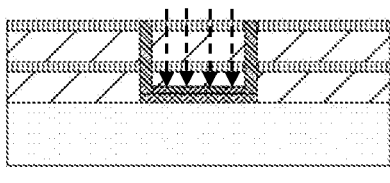
FIG. 1 shows a cross sectional view of a conventional photodiode without a lens.
Figure 2:
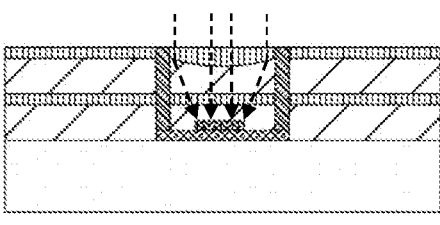
FIG. 2 shows a cross sectional perspective view of a conventional photodiode with a lens.
Figure 3A:
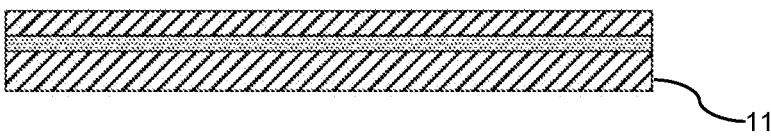
FIGS. 3A-3I show cross sectional views of the semiconductor device during fabrication process, in accordance with an exemplary embodiment of the present invention.
Figure 3B:
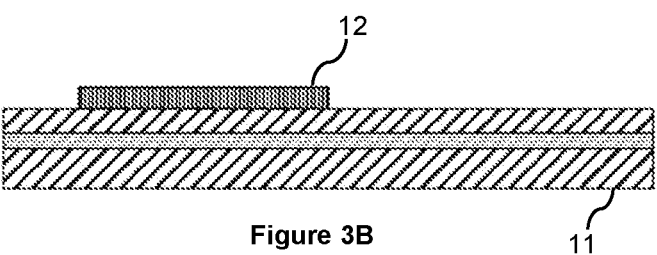

As shown in FIG. 3A, a substrate (11) is formed, wherein the substrate is a silicon on insulator (SOI) substrate. Alternatively, the substrate can be a silicon substrate, wherein additional layers of semiconductor or insulator material may be formed on the silicon substrate before forming the photonic semiconductor layer (12), as shown in FIG. 3B. The photonic semiconductor layer (12) is capable of absorbing or emitting an electromagnetic radiation such as near infrared radiation and visible light radiation.

In a preferred embodiment, the semiconductor device is a germanium (Ge) photodiode and the photonic semiconductor layer is a Ge layer epitaxially grown on the substrate by a chemical vapor deposition (CVD) process such as ultrahigh vacuum CVD (UHVCVD), reduced pressure CVD (RPCVD) and atmospheric-pressure CVD (APCVD). Alternatively, the semiconductor device can be a light emitting diode (LED), laser diode, photovoltaic cell, sensor and neutron detector, and the photonic semiconductor layer can be a layer of silicon (Si), silicon-germanium (SiGe), silicon carbide (SiC), gallium arsenide (GaAs), aluminum GaAs (AlGaAs), gallium nitride (GaN), aluminum GaN (AlGaN), indium phosphide (InP), indium GaAs phosphide (InGaAsP) or a combination of two or more semiconductors. Similarly, the photonic semiconductor layer can also be grown on the substrate by means of a molecular beam epitaxy (MBE) process. Alternatively, the photonic semiconductor layer can also be embedded in a top surface of a silicon substrate by implanting n-type or p-type dopants on the top surface by any conventional means.

Figure 3C:
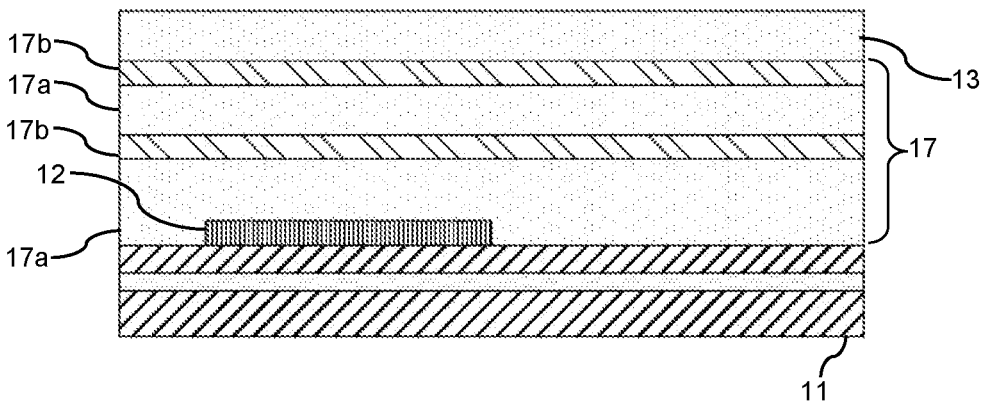

A stack (17) of one or more second insulator layers (17a) and dielectric layers (17b) is formed on the photonic semiconductor layer (12). The second insulator layers and the dielectric layers are alternately formed upon one another to form the stack, wherein a first insulator layer (13) is formed on the stack (17), as shown in FIG. 3C. Alternatively, a single dielectric layer (17b) can be formed between the photonic semiconductor layer (12) and the first insulator layer (13), as a replacement for the entire stack (17). One or more layers (17a, 17b) of the stack (17) are deposited by Plasma Enhanced Chemical Vapor Deposition (PECVD), Low Pressure CVD (LPCVD), APCVD, Sub-Atmospheric CVD (SACVD) or Physical Vapor Deposition (PVD). Preferably, the first and second insulator layers (13, 17a) are formed of silicon dioxide (SiO$_2$) and the dielectric layers (17b) are formed of silicon nitride (SiN). Alternatively, the first and second insulator layers (13, 17a) are formed of any other conventional insulator materials and the dielectric layers (17b) are formed of any other conventional dielectric materials.

Figure 3D:
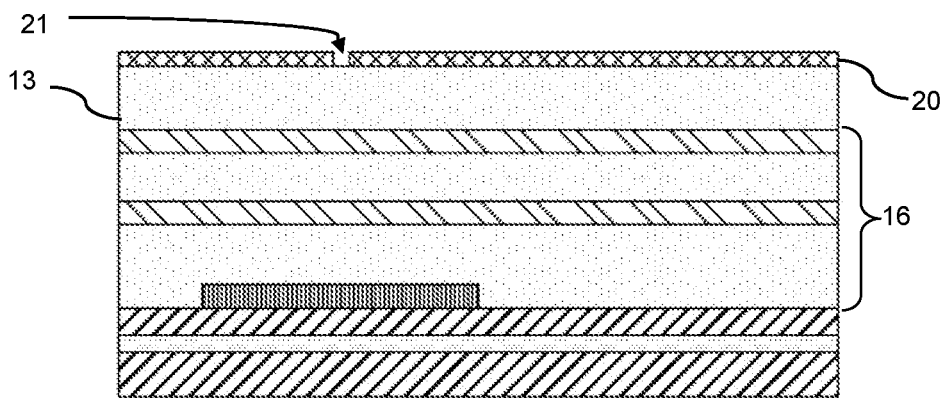

A mask layer (20) is deposited on the first insulator layer (13) and an opening (21) is formed in the mask layer, as shown in FIG. 3D, wherein the opening (21) is aligned with a center portion of the photonic semiconductor layer (12). Preferably, center of the opening (21) is aligned with center of the photonic semiconductor layer (12).

Figure 3E:
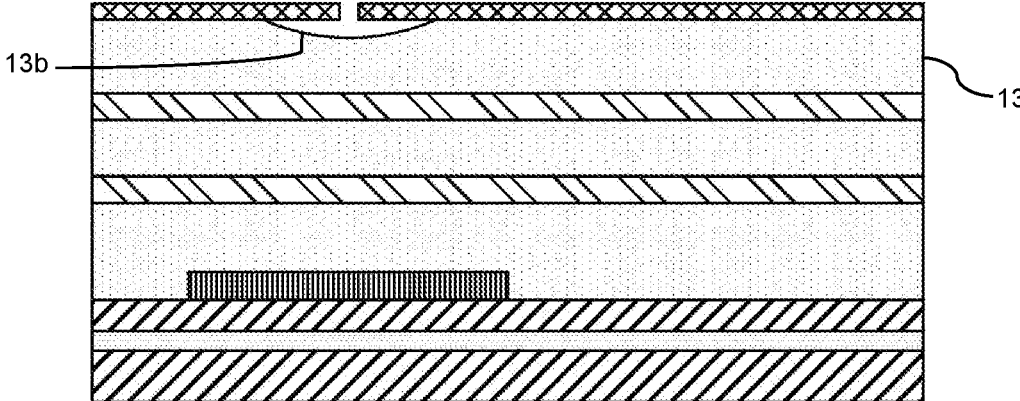
Figure 3F:
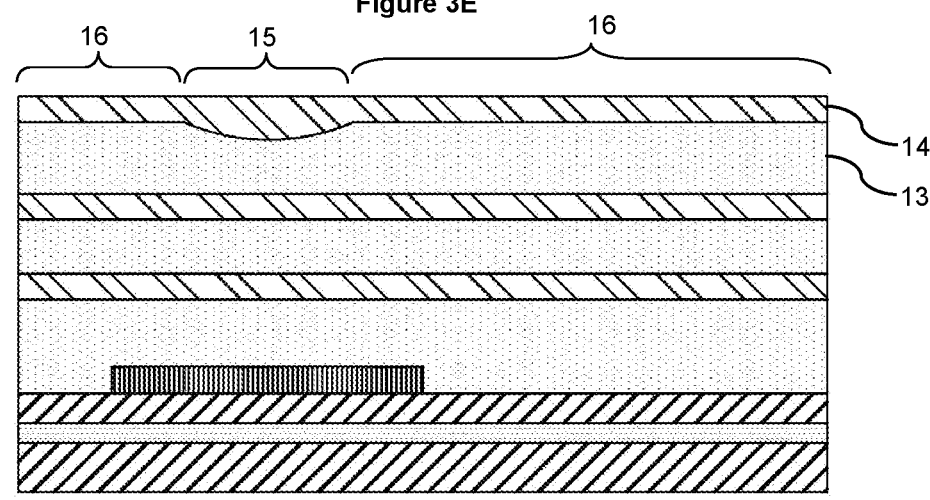

The first insulator layer (13) is etched through the opening (21), such that a second pit (13b) is formed in the first insulator layer (13), as shown in FIG. 3E. Preferably, an isotropic oxide such as buffered oxide etch (BOE), is used as an etchant for etching the first insulator layer (13). The mask layer (20) is removed through any conventional process, and then a lens layer (14) is deposited on top of the first insulator layer (13), such that a lens portion (15) is formed in the pit (13b) and a planar portion (16) is formed on the remaining portion of the first insulator layer (13), as shown in FIG. 3F. The lens layer (14) is deposited by any conventional CMOS fabrication processes like PECVD, LPCVD, APCVD, SACVD or PVD.

The lens portion (15) includes a plano convex lens, wherein the convex surface faces the photonic semiconductor layer (12) and maximum thickness of the lens portion (15) is greater than maximum thickness of the planer portion. Even though, the lens portion (15) is shown as a circular plano convex lens in FIG. 4, it is to be understood that any other conventional plano convex lens such as square-shaped plano convex lens, can also be formed Preferably, the lens layer (14) is formed of a complementary metal oxide semiconductor (CMOS) process compliant dielectric material viz. SiN. Alternatively, the lens layer (14) may be formed of any other material that allows the electromagnetic radiation to pass through and has a refractive index within a range of 1.46-2.6. Optionally, the lens layer (14) is formed by depositing multiple layers of different refractive indices and a top portion is flattened by a conventional polishing process such as chemical mechanical polishing process. For example, the lens layer (14) includes 3 different layers, wherein a lowermost layer is compatible with the first insulator layer (13), while the middle and/or the topmost layer is incompatible with the first insulator layer (13) but has higher refractive index compared to the lowermost layer. Furthermore, the top most layer can be of higher mechanical strength as compared to the middle and lowermost layers.

Figure 3G:
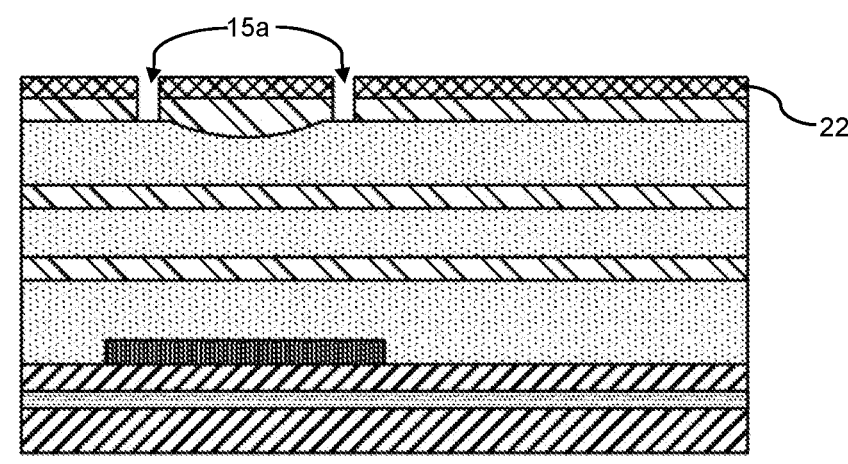
Figure 3H:
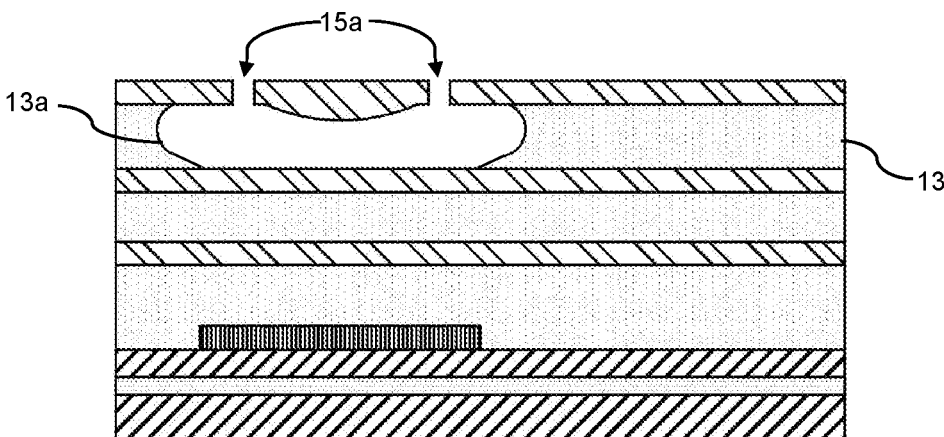

A mask layer (22) is deposited on top of the lens layer (14) and one or more holes (15a) are formed in the mask layer (22). Preferably, the holes (15a) formed around the lens portion (15), as shown in FIGS. 3G & 4. An isotropic etchant is introduced through the holes around the lens portion to etch a portion of the first insulator layer (13) beneath the lens portion (15), so as to form a cavity (13a) beneath the lens portion (15), as shown in FIG. 3H. The cavity (13a) is coaxially aligned with the lens portion (15) and perimeter of the cavity (13a) is at least equal to perimeter of the lens portion (15).

Figure 3I:
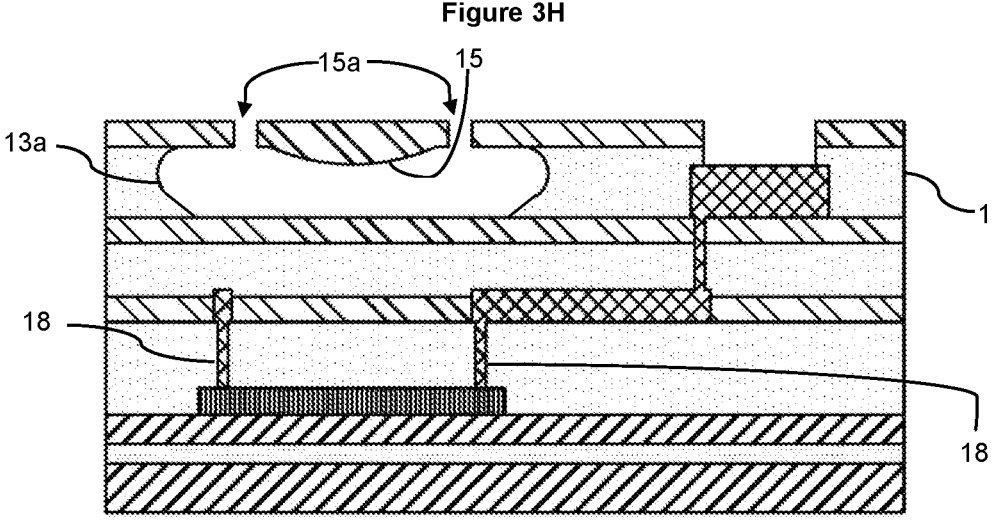

Since the portion beneath the lens portion (15) is removed, the lens portion (15) is formed as a suspended lens portion, wherein the lens portion (15) is suspended from the planar portion (16) around the lens portion (15). The mask layer (22) is removed to form the lens layer (14) as a top layer of the semiconductor device (10), as shown in FIG. 3I. Optionally, one or more additional layers can be formed on top of the lens layer (14) such as an optical filter layer and a protective shield layer.

The lens portion (15) has the maximum thickness greater than the maximum thickness of the planer portion (16). Furthermore, the cavity (13a) is formed after the lens layer (15) is deposited on the first insulator layer (13) to suspend the lens portion (15a). Thereby, the present invention allows the lens layer (14) to be formed directly on top of the first insulator layer (13), which in turn avoids a need for separately molding a suspended lens and then assembling the same on the device (10), and therefore any chances of contaminating the device (10) during fabrication is eliminated. Furthermore, since the lens layer (14) is formed directly on the device (10) itself, the lens portion (15) can be accurately aligned with the photonic semiconductor layer (12) without a need for any complicated alignment systems or processes. Additionally, the cavity (15*a*) allows the lens portion (15*a*) to be suspended without a need for a supporting means such as legs, thicker than the lens portion (15*a*), and therefore reducing a overall thickness of the device (10).

Due to the cavity (13*a*) beneath the lens portion (15), convergence angle of the radiation received by the photonic semiconductor layer (12) is narrowed, when the present invention is applied for a radiation absorbing application such as photodiode, photovoltaic cell and the like. Similarly, the cavity (13*a*) beneath the lens portion (15) broadens a divergence angle of the radiation emitted by the photonic semiconductor layer (12), when the present invention is applied for a radiation emitting application such as LED, laser diode and the like. By this way, a need for a wider photonic semiconductor layer is avoided.

Furthermore, the method (100) comprises the step of connecting two or more electrical connectors to the semiconductor device for electrically connecting the photonic semiconductor layer to one or more external devices. Optionally, the electrical connectors are connected by forming holes through one or more of the layers (12-17) and inserting the electrical connectors through the holes. Furthermore, the holes may be formed during different steps of fabricating the semiconductor device and parts of the electrical connectors are inserted into those holes between the steps. The external device can be any conventional power source, controlling devices, semiconductor components and the like. The electrical connectors are connected by forming holes through the stack, the first insulator layer and/or the lens layer and then inserting a conductive material through the holes to make electrical contact with the photonic semiconductor layer and/or the substrate. Furthermore, the connectors can include bond pads positioned on top or side surface of the semiconductor device.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises", "comprising", "including" and "having" are inclusive and therefore specify the presence of stated features, integers, steps, operations, elements and/or components, but do not preclude the presence or addition of one or more other features, integers, steps, operations, elements, components and/or groups thereof.

The method steps, processes and operations described herein are not to be construed as necessarily requiring their performance in the particular order discussed or illustrated, unless specifically identified as an order of performance. It is also to be understood that additional or alternative steps may be employed. The use of the expression "at least" or "at least one" suggests the use of one or more elements, as the use may be in one of the embodiments to achieve one or more of the desired objects or results.

The invention claimed is:

1. A semiconductor device, comprising:
   (a) a substrate;
   (b) at least one photonic semiconductor layer;
   (c) at least one first insulator layer above said photonic semiconductor layer;
   (d) at least one lens layer on top of said first insulator layer, characterized in that:
       said lens layer is deposited on said first insulator layer and includes at least one lens portion; and
       said first insulator layer includes a cavity beneath said lens portion to suspend said lens portion.

2. The semiconductor device of claim 1, wherein said photonic semiconductor layer is capable of emitting an electromagnetic radiation.

3. The semiconductor device of claim 1, wherein said photonic semiconductor layer is capable of absorbing an electromagnetic radiation.

4. The semiconductor device of claim 1, wherein said semiconductor device is at least one of a photodiode, a light emitting diode, a laser diode and a photovoltaic cell.

5. The semiconductor device of claim 1, wherein said lens layer has refractive index within a range of 1.46-2.6.

6. The semiconductor device of claim 1, wherein a stack of one or more second insulator layers and dielectric layers is formed between said photonic semiconductor layer and said first insulator layer.

7. The semiconductor device of claim 6, wherein said second insulator layers and said dielectric layers are alternately arranged upon one another to form said stack.

8. The semiconductor device of claim 1, further comprises two or more electrical connectors for electrically connecting said photonic semiconductor layer to at least one external device.

9. The semiconductor device of claim 1, wherein said lens layer includes one or more holes around said lens portion.

10. The semiconductor device of claim 1, wherein said cavity has a flat bottom surface.

11. The semiconductor device of claim 1, wherein at least 80% of a bottom surface area of said lens portion is exposed to said cavity.

12. The semiconductor device of claim 1, wherein said cavity is coaxially aligned with said lens portion.

13. The semiconductor device of claim 1, wherein a perimeter of said cavity is at least equal to a perimeter of said lens portion.

* * * * *